United States Patent [19]

Vig

[11] Patent Number: 4,638,536

[45] Date of Patent: Jan. 27, 1987

[54] METHOD OF MAKING A RESONATOR HAVING A DESIRED FREQUENCY FROM A QUARTZ CRYSTAL RESONATOR PLATE

[75] Inventor: John R. Vig, Colts Neck, N.J.

[73] Assignee: The United States of America as represented by the Secretary of the Army, Washington, D.C.

[21] Appl. No.: 819,652

[22] Filed: Jan. 17, 1986

[51] Int. Cl.$^4$ ............................................. H01L 41/22
[52] U.S. Cl. .................................. 29/25.35; 310/312; 427/100; 427/331
[58] Field of Search ............... 29/25.35; 310/312, 321; 427/100, 331

[56] References Cited

U.S. PATENT DOCUMENTS 4,130,771 12/1978 Bottom .
4,472,652 9/1984 Brice .

OTHER PUBLICATIONS

"Frequency Runing of Quartz Resonators by Plasma Anodization" by J. J. H. Reche, Proc. 33rd Ann. Symposium on Frequency Control, pp. 299–303, 1978.

*Primary Examiner*—Carl E. Hall
*Attorney, Agent, or Firm*—Sheldon Kanars; Jeremiah G. Murray; Roy E. Gordon

[57] ABSTRACT

A resonator having a desired frequency is made from a quartz crystal resonator plate by a method including the steps of:

(A) etching the quartz crystal resonator plate to a frequency slightly higher than the desired frequency, (B) vacuum desposting metallic electrodes onto the active area of the resonator plate to lower the frequency to a frequency that very closely approaches the desired frequency, and (C) treating the plate with the deposited electrodes with UV-ozone to oxidize the electrodes in a slow, precisely controlled manner to the desired frequency.

16 Claims, No Drawings

METHOD OF MAKING A RESONATOR HAVING A DESIRED FREQUENCY FROM A QUARTZ CRYSTAL RESONATOR PLATE

The invention described herein may be manufactured, used, and licensed by or for the Government for governmental purposes without the payment to me of any royalty thereon.

This invention relates in general to a method of making a resonator and in particular, to a method of making a resonator having a desired frequency from a quartz crystal resonator plate.

BACKGROUND OF THE INVENTION

Etching methods have been developed for making high frequency fundamental mode resonators at frequencies above 1 GHz. One of the major problems with such high frequency resonators is the adjustment of the resonator frequency to a desired frequency. For example, to change the frequency of an aluminum plated 200 MHz fundamental mode resonator by ±1000 Hz, the aluminum thickness on each side must be changed by ±2 °A (or by ±4 °A on one side only). This change is very difficult to produce by conventional techniques.

In U.S. Pat. No. 4,130,771, issued Dec. 19, 1978, V. E. Bottom proposed the use of anodic oxidation as a method of adjusting the frequency of quartz crystal resonators. The main drawback of this method is that, since it is a wet chemical method, it is not possible to monitor the resonator's frequency during the anodization. Moreover, the anodization solution contaminates the electrodes and thus can lead to undersirable aging.

In the paper "Frequency Tuning of Quartz Resonators by Plasma Anodization", by J. J. H. Reche, in the Proc. 33rd Ann. Symposium on Frequency Control, on pages 299-303, 1978, the use of plasma anodization is proposed for adjusting the frequency of quartz crystal resonators. Although this method overcomes the monitoring and contamination problems inherent in the wet anodization method, the method requires expensive equipment, and it subjects the resonators to undesirable levels of ionizing radiation.

In U.S. Pat. No. 4,472,652, issued Sept. 18, 1984, J. C. Brice and J. E. Curran proposed the use of thermal oxidation of aluminum electrodes, at a temperature between 250° C. and 500° C., for adjusting the frequency of quartz crystal resonators and for passivating the electrodes. The main drawback of this method is that the required high temperatures can be detrimental. For example, the epoxy in most of the silver filled epoxies used to bond the resonator plates to the mounting clips start to break down chemically at about 200° C. The high temperature treatment thus causes excessive outgassing and a significant weakening of the bond when the method is performed after the resonators are bonded. The method can be used before the resonators are bonded, however, in that case the electroded blanks must undergo undersirable handling during the bonding process.

SUMMARY OF THE INVENTION

The general object of this invention is to provide a method of making a resonator from a quartz crystal resonator plate. A more particular object of the invention is to provide such a method in which the resonator will have a desired frequency. A further object of the invention is to provide such a method of making a high frequency fundamental mode resonator in which the resonator will have a desired frequency. A still further object of the invention is to provide such a method that is dry, that is inexpensive to set up and operate, that produces no surface damage or high levels of ionizing radiation, that permits the direct and precise monitoring of the resonator frequency during the method, that permits the independent adjustment of individual electrodes on multiple electrode devices (such as monolithic crystal filters), and that minimizes the aging due to oxidation of the electrodes.

It has been found that the aforementioned objects can be attained by a method including the steps of:

(A) etching the quartz crystal resonator plate to a frequency slightly higher than the desired frequency, (B) depositing metallic electrodes onto the active area of the resonator plate to lower the frequency to a frequency that very closely approaches the desired frequency, and (C) treating the plate with the deposited electrodes with UV/ozone to oxidize the electrodes in a slow, precisely controlled manner to the desired frequency.

The etching method can be; etching in a chemical polishing etching solution; plasma etching, ion beam etching, reactive ion beam etching; or a combination of etching methods.

According to the invention, the UV/ozone enhanced oxidation of metals can be used to conveniently and precisely adjust the frequency of crystal units, to a desired frequency. The advantages of the UV/ozone method is that it is a dry method, it is inexpensive to set up and operate, it produces no surface damage or high levels of ionizing radiation, it permits the direct and precise monitoring of the resonator frequency during the adjustment process, it permits the independent adjustment of individual electrodes on multiple electrode devices (such as monolithic crystal filters), and it virtually eliminates the aging due to oxidation of the electrodes.

DESCRIPTION OF THE PREFERRED EMBODIMENT

An inverted mesa type SC-cut quartz crystal resonator plate is etched in a chemical polishing etching solution to a frequency of 101.2 MHz. Aluminum electrodes are vacuum deposited onto the active area of the resonator plate until a frequency of 100.060 MHz is reached. The resonator is then placed under a UV/ozone source. The UV/ozone source is a low pressure mercury lamp. The lamp envelope is made of high purity fused quartz which transmits the ozone generating wavelength of 184.9 nm. The frequency of the resonator is monitored and is found to decrease at the rate of about 2 kHz per minute. After about 30 minutes, the desired 100.000 MHz frequency is reached at which point the UV/ozone source is shut off and the resonator is removed from the UV/ozone source.

EXAMPLE 1

A 20 MHz fundamental mode AT-cut crystal resonator is desired. The AT-cut resonator plate is etched in a chemical polishing etching solution to a frequency of 20.060 MHz. Aluminum electrodes are vacuum deposited onto the active area of the resonator plate until a frequency of 20.003 MHz is reached. The vacuum chamber is then backfilled with 1 torr of oxygen and an ozone generating UV source within the vacuum chamber is turned on. The frequency of the resonator is found to decrease at a rate of about 100 Hz per minute. After about 3.3 minutes, the frequency reaches 20.000 MHz, the UV source is shut off, the vacuum chamber is let up to an atmosphere, and the resonator is removed from the vacuum chamber.

On multiple electrode devices, such as monolithic crystal filters, the thickness of individual electrodes can be controlled by controlling the amount of exposure to the UV source. This control can be accomplished by means of appropriate masks and shutters, or by means of a short wavelength UV laser. The rate of frequency adjustment can be increased by: increasing the ozone concentration, for example, by directing ozone to the electrodes from a separate ozone generator; increasing the temperature of the electrodes by heating the resonator to a temperature between room temperature (about 20° C.) and 400° C.; and by increasing the water or hydrogen peroxide concentration in the vicinity of the electrode.

The method is applicable to oxide forming metals other than aluminum. Such metals include copper, silver, nickel, molybdenum and various alloys. The method can also be applied to other types of resonators, such as to surface acoustic wave resonators, shallow bulk acoustic wave resonators, and resonators made of piezoelectric materials other than quartz (e.g. lithium niobate and lithium tantalate).

I wish it to be understood that I do not desire to be limited to the exact details as described for obvious modifications will occur to a person skilled in the art.

What is claimed is:

1. Method of making a resonator having a desired frequency from a quartz crystal resonator plate, said method including the steps of:
   (A) etching the quartz crystal resonator plate to a frequency slightly higher than the desired frequency,
   (B) depositing metallic electrodes onto the active area of the resonator plate to lower the frequency to a frequency that very closely approaches the desired frequency, and
   (C) treating the plate with the deposited electrodes with UV-ozone to oxidize the electrodes in a slow, precisely controlled manner to the desired frequency.

2. Method according to claim 1 wherein the resonator plate is selected from the group consisting of an AT-cut plate and an SC-cut plate.

3. Method according to claim 2 wherein the resonator plate is an AT-cut plate.

4. Method according to claim 2 wherein the resonator plate is an SC-cut plate.

5. Method according to claim 1 wherein the metallic electrodes are constituted of oxide forming metals.

6. Method according to claim 5 wherein the oxide forming metals are selected from the group consisting of aluminum, copper, silver, nickel and molybdenum.

7. Method according to claim 6 wherein the metallic electrode is constituted of aluminum.

8. Method according to claim 6 wherein the metallic electrode is constituted of copper.

9. Method according to claim 6 wherein the metallic electrode is constituted of silver.

10. Method according to claim 6 wherein the metallic electrode is constituted of molybdenum.

11. Method according to claim 6 wherein the metallic electrode is constituted of nickel.

12. Method according to claim 1 wherein the treatment in step (C) is monitored by monitoring the resonator frequency during the treatment.

13. Method according to claim 1 wherein during the treatment in step (C) ozone from an ozone generator is directed to the electrodes.

14. Method according to claim 1 wherein during the treatment in step (C) the temperature of the electrodes is increased to between room temperature and about 400° C.

15. Method of making a resonator having a frequency of 100.000 MHz from an inverted mesa type SC-cut quartz crystal resonator plate, said method including the steps of:
   (A) etching the resonator plate in a chemical polishing etching solution to a frequency of MHz,
   (B) vacuum depositing aluminum electrodes onto the active area of the resonator plate until a frequency of 100.060 MHz is reached, and
   (C) treating the plate with the deposited aluminum electrodes with UV-ozone until the desired 100.000 MHz frequency is reached.

16. Method of making a resonator having a frequency of 20.000 MHz from a fundamental mode AT-cut quartz crystal resonator plate, said method including the steps of:
   (A) etching the resonator plate in a chemical polishing etching solution to a frequency of 20.060 MHz,
   (B) vacuum depositing aluminum electrodes onto the active area of the resonator plate until a frequency of 20.003 MHz is reached, and
   (C) treating the plate with the deposited aluminum electrodes with UV-ozone until the desired 20.000 MHz frequency is reached.

* * * * *